FREQUENCY RESPONSIVE POWER TRANSFER RELAY

Filed March 29, 1963

INVENTORS.
WALTER L. SMETON, JR.
VERNER E. SWENSON
BY
Luther P. Speck
ATTORNEY.

United States Patent Office 3,277,307
Patented Oct. 4, 1966

3,277,307
FREQUENCY RESPONSIVE POWER TRANSFER RELAY

Walter L. Smeton, Jr., Inglewood, and Verner E. Swenson, Torrance, Calif., assignors to The Garrett Corporation, Los Angeles, Calif., a corporation of California
Filed Mar. 29, 1963, Ser. No. 269,096
1 Claim. (Cl. 307—85)

The relay of this invention operates in response to a control signal having a predetermined frequency to change the connection of a load from a first to a second source of electrical power.

In general the relay utilizes an asymmetrical frequency discriminator in conjunction with a transistorized electronic switch to achieve improved immunity to ambient temperature fluctuations, and high frequency sensitivity. The frequency discriminator generally comprises a resistance-inductance-capacitance network and two semiconductor diodes. The transistorized electronic switch is characterized by very high input impedance on the order of megohms, a low output impedance on the order of a few ohms, and virtual immunity to fluctuations in ambient temperature.

The prior art is replete with many types of frequency-responsive relays. However, these relays generally are characterized by one or more disadvantageous features like unreliability, fragility, frequency, insensivity or inaccuracy, complexity, and high cost. In contrast to prior art relays, those in accordance with this invention may have a high input impedance, and very low output impendance on the order of a few ohms, high reliability attributable to the use of rugged semiconductor circuitry, immunity to wide fluctuations in ambient temperature, and high sensitivity to frequency attributable to the use of a frequency discriminator having a frequency-output voltage curve of very steep slope at the desired response frequency. Moreover, operation of the novel relay of this invention requires nominal power. For example, in an actual embodiment, the ratio of controlled-to-controlling power is about 1 to 500,000, and frequency sensitivity is ± 1.0 cycle at a response frequency of 389 cycles per second throughout a temperature range of 0° to 75° centigrade.

Accordingly, the important objectives of this invention include the provision of:

(1) A frequency-responsive power transfer relay for changing the electrical connections of a load from a first to a second source of electrical power when the frequency of the latter becomes equal to a predetermined desired frequency;

(2) A sensitive frequency-responsive relay characterized by high immunity to wide fluctuations in ambient temperature;

(3) A reliable frequency-responsive relay utilizing transistors to achieve ruggedness, durability and low power consumption, and characertized further by frequency sensitivity, compactness, light weight and virtual immunity to the effects of large changes in ambient temperature on the operating parameters of its semiconductor components;

(4) A reliable, frequency-responsive relay utilizing an asymmetrical reactive network in conjunction with two semiconductor diodes for discriminating the response frequency, and a transistorized electronic switch for effecting operation of the relay in response to nominal power; and (5) Novel means of superior economy and simplicity for effectuating the aforementioned objecitves.

A preferred embodiment of the frequency-responsive power-transfer relay of this invention generally comprises an electromagnetic relay for switching the load from a first to a second source of electrical power, an asymmetrical frequency discriminator having a very high rate of change of unidirectional output voltage with frequency at the response frequency, and a transistorized switch responsive to the unidirectional output voltage of the frequency discriminator for energizing the electromagnetic relay. The electronic switch is an adaptation for use with A.C. power of the improved electronic switch described in a copending application for U.S. Letters Patent entitled High Impedance Electronic Switch by the inventors of this invention filed Mar. 1, 1963, Ser. No. 262,137.

The text set forth above is intended to summarize and emphasize the significance of this invention. For a more complete understanding, consider the structure, operation and novel features of the actual embodiment described in the following text, and represented in the accompanying drawings, wherein.

Figure 3:
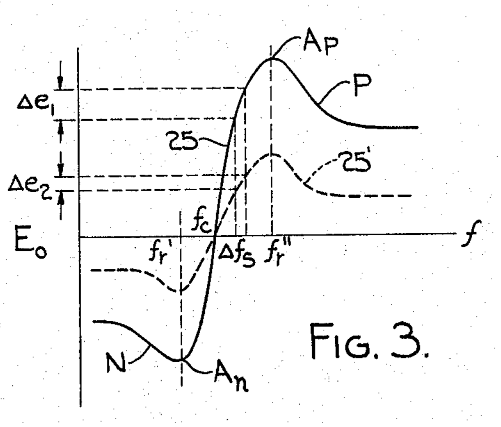
Figure 4:
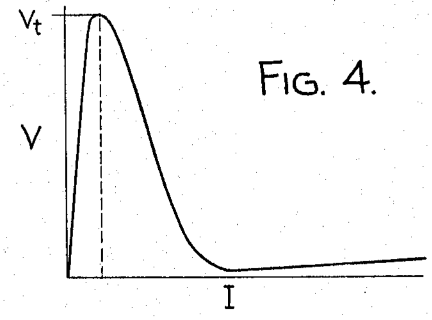

FIG. 3 portrays idealized representations of the frequency-output current transfer functions of asymmetrical frequency discriminators designed for use with a high load impedance in a first instance, and a low load impedance in a second instance; and FIG. 4 is an idealized representation of the voltage-current characteristic of a semiconductor device suitable for use in the practice of this invention.

Figure 1:
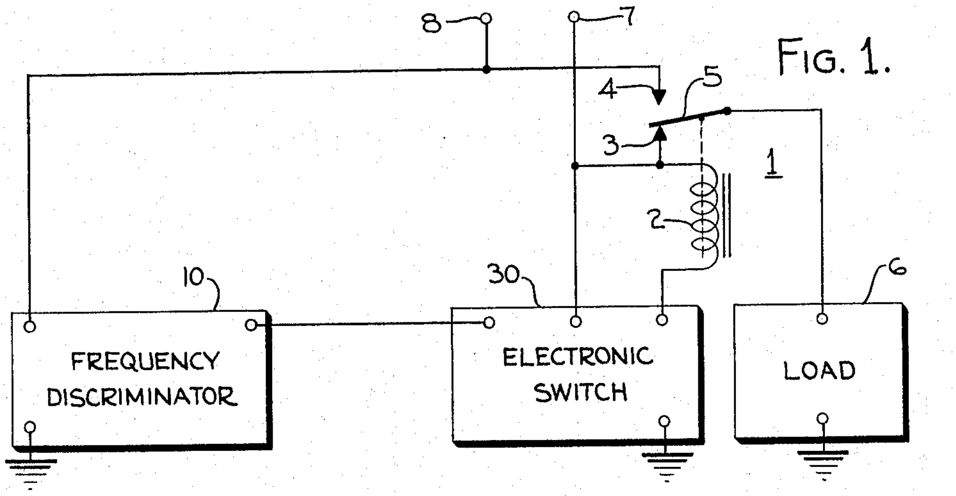
FIG. 1 is a schematic block diagram representing the main functional units of a power transfer relay in accordance with this invention.

As represented in FIG. 1, a frequency-responsive, power-transfer relay in accordance with this invention comprises an electromagnetic relay 1 for effecting the disconnection of a load 6 from a first power input terminal 7, and its connection to a second power input terminal 8. A frequency discriminator 10 coupled to the second power input terminal 8 abruptly develops a unidirectional switching voltage whenever the electrical power coupled to the latter becomes equal to a predetermined frequency. The unidirectional switching voltage actuates an electronic switch 30, and de-energizes electromagnetic relay 1 in order to effect transfer of the load 6 from the first to the second source of electrical power.

The conventional electromagnetic relay 1 is made up of a winding 2, normally-colsed contact 3, normally-open contact 4, and a contact arm 5.

The frequency discriminator 10 may be comprised of any one of several circuits well known in the art. Inasmuch as its function is to develop abruptly a unidirectional control signal for actuating the electronic switch 30 whenever the frequency of a second electrical power source (not shown), coupled to the second power input terminal 8 increases to a predetermined response frequency, the principal requisite of a suitable discriminator is that it have a transfer function with very steep slope at the response frequency, and that its output impedance approximate the input impedance of electronic switch 30. In order to minimize the number of components required to achieve adequate temperature stabilization, the output impedance of frequency discriminator 10 and the input impedance of electronic switch 30 should be as high as possible. The importance of this consideration will be explained more fully below.

The electronic switch 30 is like the one described in the aforementioned copending patent application differing only in minor respects which enable it to operate on A.-C. power. Among the important features of this switch is a very high input impedance, on the order of megohms, and virtual immunity to wide variations in ambient temperature.

Figure 2:
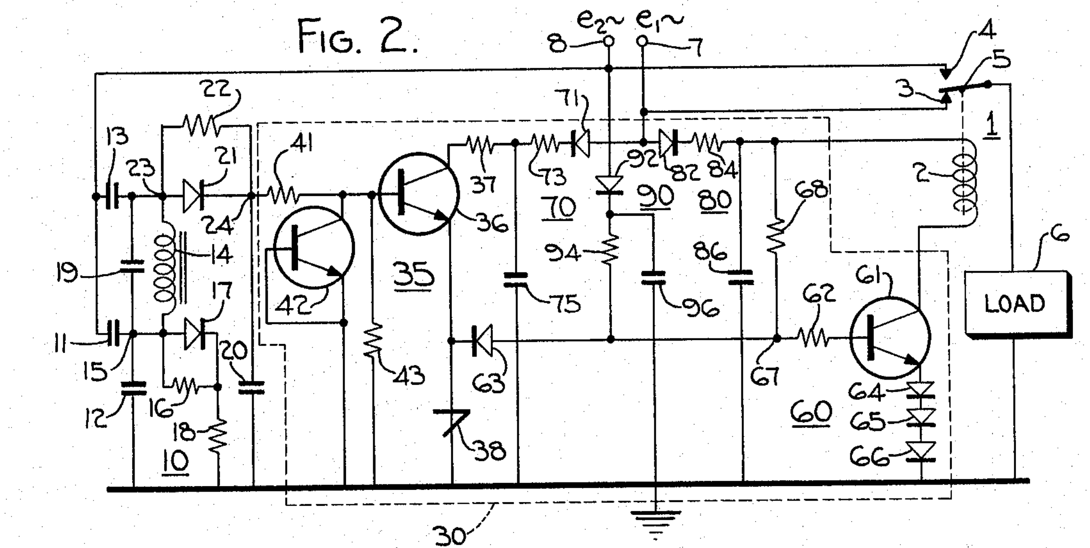
FIG. 2 is a schematic diagram representing a preferred embodiment of this invention.

As represented in FIG. 2 the frequency discriminator 10 generally comprises two capacitors, 11 and 12, coupled in series to form a voltage divider between the second power input terminal 8 and a ground source of constant potential, a capacitor 13 inductor 14, coupled in series between the second power input terminal 8 and the intermediate terminal 15 of the voltage divider, and parallel-coupled resistor 16 and diode 17 connected in series with a resistor 18 to form a circuit path between the intermediate terminal 15 and the ground source of constant reference potential. A capacitor 19 is coupled between the intermediate terminal 15 and a junction common to capacitor 13 and inductor 14 to facilitate more exact tuning of the freuency discriminator 10 to the response frequency. This capacitor may be omitted for response frequencies achievable through proper selection of circuit parameters. The unidirectional output voltage of the frequency discriminator 10 is developed across an output capacitor 20 connected via parallel-coupled diode 21 and resistor 22 to the circuit junction 23 between capacitor 13 and inductor 14.

A qualitative explanation of the operation of the discriminator 10 resulting in the frequency-output voltage characteristic of FIG. 3 will be set forth in terms of the well known frequency-impedance characteristics of capacitors and inductors. These include the fact that inductive reactance increases and capacitive reactance diminishes as frequency goes up. The very low impedance of series-resonant and the very high impedance of parallel-resonant L-C circuits at their respective resonant frequencies also is important in understanding qualitatively the operation of discriminator 10.

It should be apparent that the A.C. input signal supplied to discriminator 10 from the second power input-terminal 8 may flow through the former to the ground source of constant reference potential via three principal unidirectional paths. These are: (1) A first circuit path via series-connected capacitor 11, diode 17 and resistor 18, (2) a second circuit path via series-connected capacitor 13, inductor 14, diode 17, and resistor 18, and (3) a third circuit path via series-connected capacitor 13, diode 21, and output capacitor 20.

First, assume that the frequency of the second source of electrical power (not shown) coupled to the second input terminal 8 is increasing through a range somewhat lower than the crossover frequency $f_c$. As represented by the portion N of the characteristic curve 25, a negative voltage will be developed on the anode of diode 21, and, via resistor 22, across output capacitor 20, because the inductor 14, in this frequency range, constitutes an impedance somewhat lower than that of the third unidirectional circuit path, 13–21–20. Hence, positive half cycles of the input signal to discriminator 10 result in conduction through the first of the unidirectional circuit paths, 11–17–18 and the second circuit path 13–14–17–18, but little if any via the third circuit path 13–21–20. During negative half cycles all circuit paths through the discriminator 10 between the second power input terminal and the ground source of constant reference potential include the series-connected resistors 16 and 18, having a resistance on the order of megohms. As a result, a negative voltage developed at the intermediate terminal 15 of the capacitive voltage divider will be applied to the anode of diode 21 via inductor 14. This voltage, in turn, then results in the charging of output capacitor 20 via a resistor 22.

As the frequency of the input signal to discriminator 10 increases still further, a negative peak $A_n$ is formed in the portion N of the frequency-output voltage curve 25. The negative peak is formed when the frequency of the input signal becomes high enough to cause the capacitor 13 and inductor 14, and other associated circuit elements to become series resonant. This effectively shunts capacitor 11, and results in the application of positive half cycles of the input signal directly to diode 17. Consequently, the positive half cycles, discharged via diode 17 to the ground source of constant reference potential, have less and less effect on the negative voltage developed across the voltage divider, capacitors 11 and 12, until the series-resonant frequency $f_r$ is exceeded. When this occurs, the negative voltage diminishes rapidly and becomes zero at the cross-over frequency $f_c$.

As the input signal frequency continues to increase the output voltage rises rapidly from zero at crossover frequency $f_c$ to a positive peak $A_p$ at the apparent parallel-resonant frequency $f_r''$ of the parallel combination of inductor 14 and series-connected capacitors 11 and 13. As the input frequency continues to increase, the output voltage diminishes from the positive peak $A_p$ but remains positive thereafter to form the positive portion P of the frequency-output voltage curve.

It should be noticed that the slope of the frequency-output voltage curve 25 will be determined by the spacing of the apparent series-resonant and parallel-resonant frequencies $f_r'$ and $f_r''$, respectively, and by the amplitude of the output voltage, as determined principally by the respective positive and negative amplitudes of the output voltage at the series-resonant and parallel-resonant peaks $A_n$ and $A_p$, respectively.

It should be noticed that the formation of the positive peak $A_p$ occurs because the impedance of the parallel-resonant circuit formed by the parallel-combination of inductor 14 with series-connected capacitors 11 and 13 becomes indefinitely high, and far exceeds the impedance of the unidirectional third circuit path via capacitor 13, diode 21 and output capacitor 20. Accordingly, virtually all of the energy of the positive half cycles is made available at the anode of diode 21. This results in periodic conduction of the latter, and consequent build up of positive output voltage represented by portion P of curve 25 across the output capacitor 20. The negative half cycles effectively are blocked by diode 21 and the parallel-resonant operation of inductor 14 in combination with capacitors 11 and 13, and have slight if any effect on the resulting output voltage.

When the input signal frequency increases beyond the apparent parallel-resonant frequency $f_r''$, the impedance of inductor 14 becomes much higher than that of the capacitors in the discriminator circuit. For this reason, the second circuit path, 13–14–17–18, is less important, and attention may be focused on circuit paths 11–17–18, and 13–21–20, respectively. Under these circumstances positive half cycles entering the third circuit path 13–21–20, finding a very high impedance presented by inductor 14, develop a net positive charge on the upper plate of capacitor 13. In the frequency range below the crossover frequency $f_c$, postive half cycles of the input signal pass via a relatively low impedance circuit path via the inductor 14, diode 17, and resistor 18 to the ground source of constant potential. For this reason, most of their energy is returned to the ground source of constant potential. Hence their effect on the potential developed at the anode of diode 21 is small, and always remains less than the negative voltage stored by capacitors 13 and 11. For frequencies higher than crossover $f_c$, the greatly increased impedance of inductor 14 renders this discharge path unavailable to the postive half cycles, so that they begin to control the voltage polarity developed at the anode of diode 21.

The electronic switch 30 generally comprises a switch-control stage 35, a normally-conductive switching stage 60, half-wave rectifiers 70 and 80 for converting A.C. power from the first input terminal 7 into unidirectional voltage of positive potential suitable for energizing the switch-control and switching stages 35 and 60, and a holding circuit 90 coupled to the second power input terminal 8 for maintaining the normally-conductive switching stage 60 in an "off" condition once it has been actuated by switch-control stage 35.

The switch-control stage 35 is comprised of a high-gain NPN transistor 36, a four-layer diode 38, and temperature-compensating transistor 42. The high gain transistor 36 has a base coupled via resistor 41 to the output junction 24 of the frequency discriminator 10, a collector coupled to the first power input terminal 7 via a voltage-dropping resistor 37 and half-wave rectifier 70, and an emitter coupled to the ground source of constant reference potential via the four-layer diode 38. The temperature-compensating transistor 42 is chosen to have a reverse saturation current characteristic as close to that of the high gain transistor 36 as possible. Its collector-base circuit is coupled between the ground source of constant reference potential and the base of high gain transistor 36. A resistor 43 of very high impedance, likewise is coupled between the base of transistor 36 and the ground source of reference potential, to enhance temperature stabilization for the collector-base circuit of transistor 36. Inasmuch as the effect of changes in ambient temperature on the flow of reverse saturation current is the same for high-gain transistor 36 and temperature-compensating transistor 42, the effective bias potential present on the base of the high-gain transistor 36 remains unchanged.

The half wave rectifier 70 provides unidirectional operating potential of positive polarity to high gain transistor 36, and comprises a semi-conductor diode 71, resistor 73, and capacitor 75.

The switch-control stage 35 is characterized by a very high input impedance, on the order of megohms, resulting from the high-gain of transistor 36 and the presence of the four-layer diode 38 between its emitter and the ground source of reference potential. The high input impedance of the switch-control stage 35 is an important factor in achieving a transfer function for frequency discriminator 10 having the requisite steep slope at the desired response frequency. In addition, this feature helps insure that the relay will respond to an input signal of desired frequency notwithstanding wide variations in ambient temperature. This will be explained with reference to FIG. 3 wherein the solid curve 25 represents the transfer function of frequency discriminator 10 when coupled to a load of very high impedance like that provided by the switch-control stage 35, and the broken curve 25' represents the transfer function of the discriminator 10 when a hypothetical load of low impedance is coupled between its output terminal 24 and the ground source of reference potential. If the relay is designed to respond to an input signal frequency within the narrow range $\Delta f_s$, it should be apparent that the resulting voltage applied to the base of the high gain transistor 36 will vary within a relatively wide range, $\Delta e_1$. On the other hand, where the frequency discriminator 10 drives a low impedance load, the voltage resulting from an input signal of frequency $\Delta f_s$ applied to the base of high gain transistor 36 will vary within the relatively narrow range, $\Delta e_2$. From the foregoing, it should be apparent that the wider variation of voltage developed on the base of the high gain transistor 36 when the latter forms part of a high impedance load for the frequency discriminator 10 is preferable in order to insure that the four-layer diode 38 of the switch-control stage 35 will breakdown and conduct heavily at a frequency $f_s$, notwithstanding wide variations in its breakdown potential caused by concomitant fluctuations of ambient temperature. In an actual embodiment, for example, the breakdown voltage of the four layer diode 38 may vary as much as four volts between temperature limits of zero and seventy-five degrees centigrade. Although the unidirectional voltage $\Delta e_1$ applied to the base of high gain transistor 36 remains on the order of microvolts, it always will be sufficient to reduce the effective impedance of the collector-emitter path enough to result in the application of breakdown voltage to the four-layer diode 38. Hence, precipitous conduction through the latter at the desired response frequency $\Delta f_s$ regardless of wide changes in ambient temperature.

The normally-closed switching stage 60 comprises an NPN transistor 61 having a base coupled to the switch-control stage 35 via series-coupled current limiting resistor 62 and semiconductor diode 63, a collector coupled to the first power input terminal 7 via the winding 2 of electromagnetic relay 1 and half-wave rectifier 80, and an emitter coupled to the ground source of constant reference potential via series-connected semiconductor diodes 64, 65 and 66. Sufficient positive voltage is applied to the base of switching transistor 61 from the first power input terminal 7 via a circuit path including the half wave rectifier 80, and biasing resistor 68 to maintain the latter in a conductive state until the frequency of the source (not shown) coupled to the second power input terminal 8 increases to the desired response frequency. The half-wave rectifier 80 is made up of semiconductor diode 82, resistor 84, and capacitor 86.

Once the switching stage 60 is turned off by the frequency discriminator 10 and the switch-control stage 35, it is maintained in the "off," or non-conductive state, by a holding circuit 90 made up of semiconductor diode 92 and resistor 94 coupled effectively in series with the diode 63 and four-layer diode 38, and a capacitor 96 coupled between the cathode of diode 92 and the ground source of constant reference potential.

In operation, the power transfer relay initially is energized from a source (not shown) of electrical power coupled to the first power input terminal 7. Under these conditions, the switching stage 60 is closed, so that the winding 2 of the electromagnetic relay 1 is energized and power is supplied to load 2 via relay contact 3. At the same time, unidirectional voltage of positive polarity is developed by the half-wave rectifier 70 and applied to the switch-control stage 35. Accordingly, when the frequency of electrical power coupled to the second power input terminal 8 increases to the predetermined response frequency, the frequency discriminator 10 abruptly develops a positive output voltage of a few microvolts, a voltage sufficient to actuate the switch-control stage 35. This has the effect of applying an abrupt negative-going voltage to the base of the switching transistor 61 at the predetermined response frequency sufficient to "open" the switching stage 60. This allows the contact arm 5 of polarized electromagnetic relay 1 to transfer from normally-closed contact 3 to normally-open contact 4, so that the load 2 then receives electrical power from the second power input terminal 8.

The effective input impedance of the switch-control stage 35 is on the order of megohms. This is attributable to the high gain of transistor 36, and the virtual open-circuit impedance of the four-layer diode 38 in its emitter circuit. When a very small positive voltage appears at the base of the high-gain transistor 36, the effective impedance of its collector-emitter circuit path diminishes abruptly. This suddenly applies sufficient positive voltage from the first power input terminal 7 to cause breakdown and precipitous conduction through the four-layer diode 38. As a consequence, the circuit junction 67 between the current-limiting resistor 62 and base-coupling diode 63 becomes coupled effectively to the ground source of constant reference potential, and conduction ceases through the switching transistor 60. As described above, this has the effect of disconnecting the source (not shown) of electrical power coupled to the first input terminal 7, so that bias voltage no longer is applied to the switch-control stage 35. Nonetheless, the switching transistor 60 remains "open" on account of the holding circuit 90. This circuit provides a conductive path between the second power input terminal 8 and the four-layer diode 38 for passing enough current to maintain the latter in a conductive state.

Although this invention has been described with reference to an actual embodiment utilizing an asymmetrical frequency discriminator, it should be understood that this circuit may be replaced with any one of several other conventional frequency discriminators having appropriate frequency sensitivity and output impedance characteristics. Moreover, other devices having negative resistance characteristics similar to that shown in FIG. 4 for the four-layer diode 38 may be utilized in the emitter circuit of switch-control stage 35. The only requisites are that the negative resistance device conduct little if any current until the threshold, or breakdown voltage $V_t$, is applied across it via the collector-emitter path of the high-gain transistor 36, and that current then shall begin to flow precipitously. For example, double base diodes, diffused-silicon avalanche diodes, and tunnel diodes may be substituted for the four-layer diode 38 provided suitable adjustments are made in the design parameters of the circuit. Furthermore, PNP transistors may be utilized in lieu of the NPN transistors depicted in the drawings, provided the voltage polarities and the orientation of diodes are reversed.

In an actual embodiment of this invention, components having the following values were found to give satisfactory performance:

| | |
|---|---|
| Transistors **36, 42** | Type 2N844. |
| Transistor **61** | Type 2N547. |
| Four-layer diode **38** | 4E20M-3. |
| Diodes **17, 21** | CD1143. |
| Diode **63** | 1N660. |
| Diodes **64, 65, 66, 71, 82, 92** | 1N645. |
| Capacitors **11, 13** | .027 mf. |
| Capacitors **12, 20** | .010 mf. |
| Capacitor **19** | 100–910 mmf. |
| Capacitor **75** | .047 mf. |
| Capacitor **86** | 25.0 mf. |
| Capacitor **96** | 3.5 mf. |
| Inductor **14** | 10.0 henrys. |
| Resistor **16** | 2.0 MΩ. |
| Resistor **18** | 510.0 KΩ. |
| Resistor **22** | 10.0 MΩ. |
| Resistor **37** | 6800Ω. |
| Resistor **41** | 3000Ω. |
| Resistor **43** | 3.9 MΩ. |
| Resistor **62** | 680Ω. |
| Resistors **68, 94** | 2000Ω. |
| Resistor **73** | 20Ω. |
| Resistor **84** | 5Ω. |
| $f_s$ | 389 cps. |
| $\Delta f_s$ | ±1 cps. |
| $e_1$ | 26±5% v. R.M.S. |
| $e_2$ | 0.0 v.–26.0±5% v. R.M.S. |

It is anticipated that the novel concepts expressed or inferable from the drawings and text of this disclosure will enable the design of a variety of embodiments within the scope of the invention as represented in the following claim.

We claim:

A transistorized, frequency-responsive, power-transfer relay characterized by high reliability, high sensitivity, and virtual immunity to the effects of wide fluctuations in ambient temperature on the operating parameters of semiconductor components, the relay comprising:

a first pair of input terminals for a first source of electrical power;

a second pair of input terminals for a second source of periodic electrical power of variable frequency;

a pair of output terminals;

means coupled between the output terminals and the first and second pairs of power-input terminals for disconnecting the first and connecting the second pair of input terminals to the output terminals;

an electronic switch responsive to a control signal on the order of microwatts for actuationg the disconnecting and connecting means, the switch including a semiconductor amplifier having a controlling element and an output circuit coupled in series with a semiconductor device operable in a negative-resistance mode to form a switch input circuit having an impedance on the order of megohms;

and a frequency discriminator coupled to the second pair of input terminals and to the control element of the semiconductor amplifier, and including two diodes and a tuned inductance-capacitance circuit incorporated in a network characterized by series-resonant and parallel-resonant properties, so that a switch-control signal will be generated whenever second-source electrical power increases to a predetermined frequency between the apparent series-resonant and parallel-resonant frequencies of the network.

References Cited by the Examiner

UNITED STATES PATENTS

| | | | |
|---|---|---|---|
| 1,859,069 | 5/1932 | Beekman | 307—64 |
| 2,885,568 | 5/1959 | Reeder | 307—87 |
| 2,998,551 | 8/1961 | Moakler | 322—32 X |
| 3,069,555 | 12/1962 | Kessler | 307—87 |
| 3,069,556 | 12/1962 | Apfelbeck | 307—87 |
| 3,069,558 | 12/1962 | Burt | 328—138 X |
| 3,209,212 | 9/1965 | Billings | 317—147 |

ORIS L. RADER, *Primary Examiner.*

T. J. MADDEN, *Assistant Examiner.*